United States Patent [19]

Calhoun et al.

[11] 3,795,975

[45] Mar. 12, 1974

[54] MULTI-LEVEL LARGE SCALE COMPLEX INTEGRATED CIRCUIT HAVING FUNCTIONAL INTERCONNECTED CIRCUIT ROUTED TO MASTER PATTERNS

[75] Inventors: Donald F. Calhoun, Inglewood; Barry Bennett, Wilmington, both of Calif.

[73] Assignee: Hughes Aircraft Company, Culver City, Calif.

[22] Filed: Dec. 17, 1971

[21] Appl. No.: 209,397

Related U.S. Application Data

[63] Continuation of Ser. No. 16,840, March 5, 1970, abandoned.

[52] U.S. Cl. .................... 29/574, 29/577, 29/628, 317/101 A

[51] Int. Cl. .................... B01j 17/00, H01l 19/00

[58] Field of Search .................. 156/11, 12, 13, 17; 317/101 A, 235; 29/577, 574, 628

[56] References Cited

UNITED STATES PATENTS

| | | | |
|---|---|---|---|
| 3,627,598 | 12/1971 | McDonald | 156/11 |
| 3,615,466 | 10/1971 | Sahni | 29/577 |
| 2,982,002 | 5/1961 | Shockley | 317/101 A |
| 3,423,822 | 1/1969 | Davidson et al. | 317/101 A |
| 3,303,400 | 2/1967 | Allison | 317/101 A |
| 3,434,020 | 3/1969 | Ruggiero | 317/101 A |
| 3,518,751 | 7/1970 | Waters et al. | 317/101 A |
| 3,558,992 | 1/1971 | Heuner et al. | 317/101 A |
| 3,498,833 | 3/1970 | Lehrer | 156/17 |

FOREIGN PATENTS OR APPLICATIONS

| | | | |
|---|---|---|---|
| 1,117,579 | 6/1968 | Great Britain | 317/101 A |

*Primary Examiner*—David Smith, Jr.
*Attorney, Agent, or Firm*—W. H. MacAllister

[57] ABSTRACT

A complex integrated circuit comprising a waver having a plurality of cells each having signal connect pads in a first layer of metalization on the wafer and which have an imperfect yield of usable cells and further including a laminae of alternate layers of dielectric insulation and metalization formed on the wafer wherein: a first layer of insulation has vias formed therethrough to expose signal connect pads of selected usable cells; a second layer of metalization has conductors formed therein which operably interconnect the exposed signal connect pads of one or more groups of usable cells into individual functional circuits and, where needed, includes pad relocation conductors which route the signal connects of individual cells and the signal connects of interconnected groups of cells to master pattern circuit locations; a second layer of insulation has vias formed therethrough which expose signal connect portions at the master pattern circuit locations; and a third layer of metalization is formed into conductors that interconnect the signal connects at master pattern locations into a functionally specified circuit type.

8 Claims, 7 Drawing Figures

INVENTORS.
DONALD F. CALHOUN,
BARRY BENNETT,
BY
Robert Thompson
ATTORNEY.

MULTI-LEVEL LARGE SCALE COMPLEX INTEGRATED CIRCUIT HAVING FUNCTIONAL INTERCONNECTED CIRCUIT ROUTED TO MASTER PATTERNS

This is a continuation of U.S. Pat. application Ser. No. 16,840 filed Mar. 5, 1970, now abandoned.

BACKGROUND OF THE INVENTION

This invention relates generally to improvements in the fabrication of multi-level complex integrated circuits and relates more particularly to means and methods of interconnecting cells of a wafer having an imperfect yield by interconnecting and routing the signal connects of cells to master pattern circuit locations in one level of metalization that are compatible with a master pattern of interconnect conductors in a next upper layer of metalization.

In integrated circuit technology wafers having a nonuniform yield of usable cells have heretofore been interconnected into functional circuit types by producing a plurality of masks tailored for that particular wafer's yield distribution, each mask being associated with an individual alternate layer of dielectric insulation or metalization formed on the wafer.

The first one of these masks was utilized during fabrication to define and form feedthroughs or vias in a first layer of insulation exposing the pads of selected usable cells at the first layer of metalization on the wafer. A second mask was utilized to form a second layer of metalization into conductors associated with the vias in the first layer of insulation and routed into coincidence with via locations which were subsequently formed in a second layer of insulation by a third mask. At least one and possibly more alternate layers of metalization were formed on top of the second layer of insulation and fabricated into interconnect lines and cross-overs as defined by at least a fourth mask whereupon all of the selected usable cells were electrically interconnected into a functionally specified complex integrated circuit type.

Thus, it can be seen that this technique required that the multiple mask for each wafer had to be tailored or laid out for a particular wafer since the yield distribution of usable cells varied from wafer to wafer.

SUMMARY OF THE INVENTION

Objects, features and advantages of this invention can be attained with provision of an integrated circuit wafer having a nonuniform yield distribution of usable cells and alternate layers of dielectric insulation and metalization formed in a laminae on top of the wafer. The first layer of insulation has vias fabricated therethrough tailored to that particular wafer yield distribution for exposing signal connects of selected usable cells to a second layer of metalization formed thereupon. This second layer of metalization is in turn formed into conductors which functionally interconnect the exposed signal connects of a number of the usable cells into one or more of a number of commonly used functional circuits and, where needed, includes pad relocation conductors which route signal connects including signal connects for the functionally interconnected groups of cells and any exposed signal connects for individual cells to master pattern circuit locations. Thereafter a second layer of insulation having vias at master pattern circuit locations is formed thereupon to expose the signal connects at the master pattern locations of the second layer of metalization. Then a third layer of metalization is formed on top of the second layer of insulation and formed into a fixed or master pattern of interconnect lines as defined by a standard mask to functionally interconnect the master pattern signal connects of usable cells into a specified circuit part type.

Advantages of this circuit are that: a reduction is made in the number of point to point connections occuring in the third level of metalization having the fixed or master pattern conductor routing thereon; there is a decrease in the number of master pattern circuit locations required in fabricating a complex integrated circuit array since cells are first interconnected in the second layer of metalization; there is a decrease in the number of pad relocation lines required in the second level of metalization pattern; there is a significant reduction in the average signal line length in both the second and third layers of metalization due to the shortened line length usable to functionally interconnect usable cells whereupon signal degradation resulting from line resistance and capacitance is reduced.

BRIEF DESCRIPTION OF THE DRAWINGS

Other objectives, features and advantages of this invention will become apparent upon reading the following detailed description and referring to the accompanying drawings wherein.

DESCRIPTION OF A PREFERRED EMBODIMENT

Figure 1:
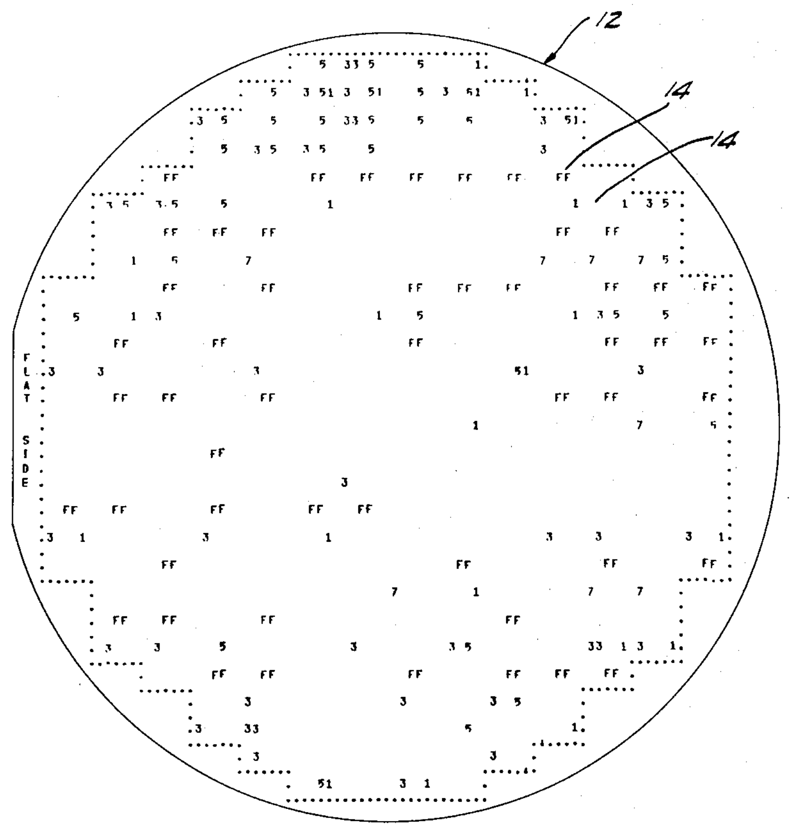
FIG. 1 is a schematic graphical illustration of the yield distribution of usable cells relative to a master pattern of cell locations wherein selected usable cells are relocated to master pattern cell locations as illustrated schematically by the line having an arrowhead.

Referring now to the drawings in more detail, FIG. 1 illustrates an integrated circuit wafer 12 having a predominantly circular periphery except for one portion thereof which is formed as a straight edge so that the integrated circuit wafer can be properly oriented. The integrated circuit wafer 12 is further divided into a plurality of individual integrated circuit cells 14 which are generally rectangular and, in the embodiment illustrated, arranged in a rectilinear array. Each one of these cells can, for example, be 0.060 inch by 0.060 inch and larger and is electrically separated from the adjacent cells by a border of electrically isolating material. The cell itself can include a plurality of active circuit elements such as semiconductor diodes and transistors and passive elements such as conductors, resistors, and capacitors. These elements are coupled together by metalization in the wafer 12 into a predetermined circuit configuration so that when electrical signals are applied to signal connects of the cells, it will operate in a predetermined manner.

Figure 2A:
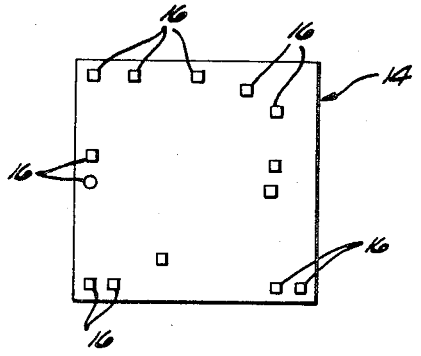
FIG. 2*a* is an enlarged top plan view schematically illustrating exemplary pad locations in the first layer of metalization of an integrated circuit cell.

In order to facilitate signal connections with the individual cells 14 each cell includes a plurality of signal connect members or pads 16 (FIG. 2*a*) located at termination ends of signal lines. These pads 16 usually have a somewhat larger dimension and area than the signal line widths which they are associated with. For example, the pads 16 can have a dimension of 0.003 inch × .003 inch whereas the associated conductor may only be 0.001 inch wide. There can, for example, be 14 or possibly more or fewer of these pads 16 associated with each cell. The active and passive elements of each cell are usually arranged internally of the cell 14 so that electrical signals can be applied to some of the pads 16 whereupon a portion of the integrated circuit components can be used as a gate, flip-flop, or other circuit element; or else input or output lines can be coupled to all of the pads of a cell so that that cell operates as a complete logic circuit. Hereinafter when the term cell is used it should be understood that this is intended to cover both the entire cell of any functional portion thereof. Furthermore, in those instances where the term "usable cells" is used it is intended to be synonymous with the term "good cells" or any portion thereof.

The yield of usable cells to total cells on the wafer 12 has heretofore been less than 100 percent. For example, the yield typically can be between 20 and 80 percent and possibly more. With such yield there is no discernible pattern to the specific locations of usable cells 14 and unusable cells 14 since they are located unpredictably across the array even though there is a tendency for good cells 14 to be predominantly located toward the center of the wafer 12.

In order to determine which of the cells 14 is usable or good, they are generally tested electrically so that the good cells can be determined and properly identified. Generally a d.c. electrical test is made of each circuit to obtain adequate identification of the good circuit. In addition, further a.c. electrical testing of the good cells can be performed for added confidence in the operational capabilities of the circuit.

After electrical testing of the cells 14 has been completed, it is usually determined that the unusable cells occur in an unpredictable pattern as exemplified by the symbols 1, 3, 5, 7 and FF located within the rectangular integrated circuit cells 14 of FIG. 1. In this particular example: the symbol 1 is representative of a defective one input NAND gate; the symbol 3 is representative of a defective throw input NAND gate; the symbol 5 is representative of a defective five input NAND gate; the symbol 7 is representative of a defective seven input NAND gate; and the symbol FF is representative of a defective flip-flop. Those cells that do not have one of the above identified symbols located therein are representative of a good or usable integrated circuit cell 14.

The pads 16 of selected usable cells 14 are left exposed by means of vias through a first layer of dielectrical insulation 22. Thereafter groups of cells 14 can be interconnected into functional circuits such as, for example, latch flip-flops, half adders, exclusive OR gates, etc. in a second level of metalization 28 by means of cell interconnect conductors 18 formed therein and routed between the exposed pads as will be explained in more detail with reference to FIG. 4. If signal connect portions of these cell interconnect conductors do not coexist at, or are not in registry with, master pattern circuit locations, signal connect relocation conductors 20 are routed from the cell interconnect conductors 18 to master pattern circuit locations.

When a master pattern circuit location does not contain or coexist with the signal connects of a usable cell or cells it is necessary to relocate the pads 16 of a selected nearby usable cell 14 to pad locations at a master pattern circuit or cell location in a manner to be described in more detail subsequently with reference to FIG. 4.

As a result of the relocation of the signal connects of selected cells 14 to the master pattern circuit location where no signal connects would otherwise be found, a common or master pattern of signal connects is effectively established. This allows standard or master pattern masks of vias and interconnect lines to be used to form an additional top layer of master pattern interconnect lines for interconnecting the individual and functionally interconnected cells 14 together into a specific part type, as will be described in more detail with reference to FIG. 5.

Figure 2B:
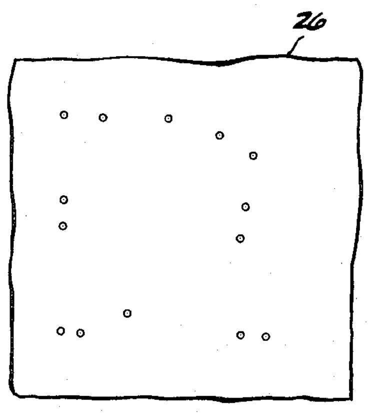
FIG. 2*b* is an enlarged schematic illustration of a portion of a mask of the type associated with the vias in a layer of insulation to expose the pads of an integrated circuit cell.
Figure 3A:
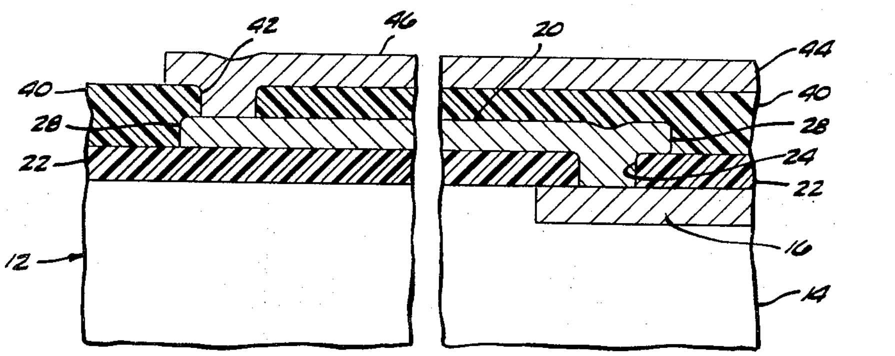
FIG. 3*a* is an enlarged cross-sectional side elevational view, not to scale, illustrating the relationship between the integrated circuit cell, vias in a first layer of dielectric insulation, pad relocation lines in a second layer of metalization, a master pattern vias in a second layer insulation, and master pattern interconnect lines in a third layer of metalization.

Reference is now made to one such fabrication of a complex integrated circuit, specific processing details of several techniques being described in my copending U.S. Pat. application Ser. No. 762,459, entitled Integrated Circuit Interconnections, and filed on Sept. 25, 1968. As illustrated in FIG. 3*a*, the first layer of metalization integral with the surface of the wafer 12 and containing the pads 16 (FIG. 2*a*) has a layer of dielectric insulation material 22 such as low sodium glass or quartz formed thereon with vias 24 or feedthroughs processed therethrough in registration with the pads 16 of selected cell 14. These vias 24 are formed in the insulation 22 by a photoprocess such as by utilizing a via mask 26 produced for that particular wafer, a portion of which is shown in FIG. 2*b*. This via mask 26 selectively exposes a layer of photoresist so that a portion of the photoresist remains over the selected pads 16 while the layer of insulation 22 is formed. When the photoresist is subsequently removed, vias 24 are formed through the insulation 22 which expose the pads 16.

It should be understood that the entire mask 26 for vias 24 has not been illustrated in detail in FIG. 2*b* since the scale on patent drawings is too small to adequately illustrate a vias aperture having an actual dimension of 0.001 inch. However, the specific location of vias 24 in the first layer of electrical insulation 22 can be identified and determined by referring to FIGS. 4 and 5 wherein the vias 24 are located at the termination ends of individual conductors in the second layer of metalization that are not coincident with another terminating end of conductors in the third layer of metalization or when the two extra metalization layers of interconnects are superposed over one another.

Figure 4:
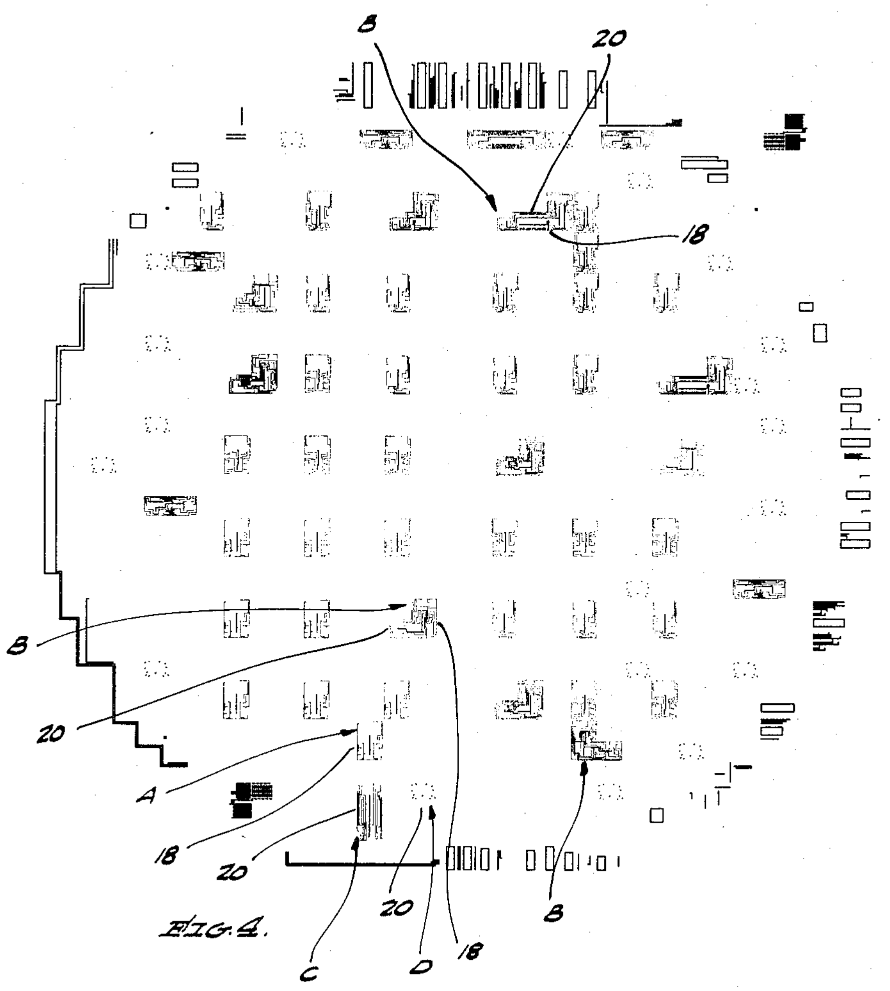
FIG. 4 is a top plan view of the second layer of metalization illustrating cell interconnect conductors and pad relocation conductors formed therein.

For purposes of illustration, the enlarged cross-sectional view, not to scale, in FIG. 3*a* schematically illustrates a via 24 extending from a pad 16 in the first layer of metalization on the face of an integrated circuit cell 14 to the second layer of metalization 38 such as, for example, aluminum which contains the cell interconnect conductors 18 and signal connect relocation lines 20 illustrated in FIG. 4.

More specifically, as illustrated in FIG. 4, the second layer of metalization 28 includes cell interconnect lines 18 for functionally interconnecting a plurality of cells together as a functional building block at the second layer of metalization. The cell interconnect lines 18 include a plurality of straight line segments illustrated as being routed parallel to rectilinear coordinates between selected exposed pads 16 of a plurality of cells. In the particular embodiment illustrated, two cells are functionally interconnected by the cell interconnect lines 18. Of course, it is possible to functionally interconnect the gates of a single cell or the gates of more than two cells. Termination ends of these cell interconnect lines and signal connects thereof are coupled to the exposed pads 16 through vias 24 to the first layer of dielectric insulation 22.

Referring to specific conductor routing in FIG. 4, the two cells are interconnected into a functional building block by the cell interconnect conductors 18 indicated generally as the group of conductors A. Portions or segments of these cell interconnect conductors 18 are routed to and through master pattern circuit locations, whereat signal connects can be made, so that there is no need for separate signal connect relocation lines 20. A second group of conductors B include cell interconnect conductors 18 routed between the exposed pads of two cells to connect them into a functional building block and further includes signal connect relocation lines 20 which are routed between signal connect portions of the cell interconnect conductors 18 and master pattern circuit locations. The termination ends of these signal connect conductors 18 at the master pattern circuit locations are formed into enlarged area pads to facilitate connection therewith. The group of conductors C illustrate signal connect relocation lines 20 routed from the exposed pads of a single cell to master pattern circuit locations. The group of conductors D illustrate conductors 20 associated with a usable cell which occurs in coincidence with or in registry with a master pattern circuit location whereupon the pads are brought to the second level of metalization in registry with the cell. Of course, it is possible to first relocate the pads of a usable cell to master pattern circuit location by lines 20 and then to functionally interconnect the signal connects of cells at master pattern circuit locations.

The cell interconnect lines 18 of those groups of cells which do not include signal connect relocation lines 20 can be fabricated into an enlarged area or pad at the master pattern circuit locations where desired to facilitate connection therewith. It should also be noted that the line lengths for the cell interconnect lines 18 and the signal connect relocation lines 20 in the second level of metalization are short. As previously mentioned with reference to FIG. 1, these signal connect relocation lines 220 are each routed from pads 16 of selected usable cells or from cell interconnect conductors 18 to a master pattern circuit location. These master pattern circuit or cell locations include not only areas congruent to and superposed over wafer cells 14 but also includes areas above the wafer not in registry with or superposed over any one cell or bounded by any cell. For example, such master pattern locations can be the relocated signal connect end or pads of the signal connect relocation conductors 20. Although these pad relocation lines are typically straight line segments 0.003 inch wide on 0.004 inch centers extending parallel to rectilinear coordinates, it would be possible to use other configurations and routing. The signal connect portions of the signal connect relocation conductors 20 are generally dimensioned at least as wide as a pad or can be formed into enlarged area pads (FIG. 4) or can be made narrower.

Figure 3B:
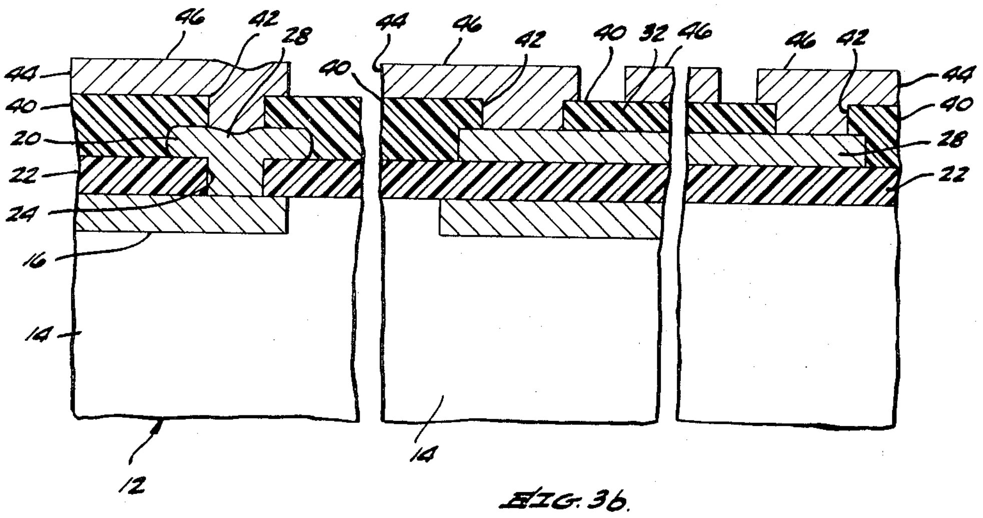
FIG. 3*b* is an enlarged cross-sectional side elevational view, not to scale, illustrating the relationship of the layers of dielectric insulation and vias between the pads of a usable integrated circuit cell and the master pattern interconnect line in a third layer of metalization, and in addition illustrates the relationship between master pattern vias in the second layer of insulation and cross-unders in the second layer of metalization.

Furthermore, as illustrated in FIG. 3*b* where a good cell 14 coexists at a master pattern circuit location, the via 24 formed through the first layer of electrical insulation 22 merely exposes the pad 16 of that good cell without necessarily requiring further routing of pad relocation lines 20 such as illustrated in FIG. 3*a*.

In addition to the pad relocation lines 20, the second layer of metalization 28 can include a plurality of cross-under conductor segments 32 located at reserved locations on the face of the first layer of insulation 22.

It should also be understood that these individual cell interconnect conductors 18 and signal connect relocation lines 20 are also formed in the second layer of metalization 28 by a photo process utilizing photoresist material and etching techniques, as described in more detail in my above referenced copending patent application. One technique is to expose the photoresist with a mask having conductors of the type illustrated in FIG. 4 tailored to the yield distribution of each wafer wherein the master pattern circuit locations are common to a plurality of wafers.

A second layer of dielectric insulation 40, such as for example, low sodium glass or quartz, is formed on top of the second layer of metalization 28 with fixed position or master pattern vias 42 formed at master pattern circuit locations by a master pattern mask common to all wafers which have the signal connects of usable individual and functionally interconnected cells at master pattern circuit locations and which are to be fabricated into a specific part type. A portion of these vias 42 expose the terminating ends, signal connect portions, or pads, of cell interconnect lines 18 and pad relocation lines 20 in the second layer of metalization 28 as illustrated in FIG. 3*a*. In addition, some of the vias 42 are superposed over the vias 24 in the first layer of electrical insulation 22 as illustrated in FIG. 3*b* so that the pads 16 of the good cell in registry with the master pattern cell location are exposed to the top layer or third layer of metalization 44. In addition, some vias 42 can be formed between terminating ends of standard pattern conductors 46 and the selected cross-under conductor segments 32. It should be noted that the cross-unders 32 are not otherwise connected with the pads in the first layer of metalization or with pad relocation lines 20 in the second layer of metalization.

Figure 5:
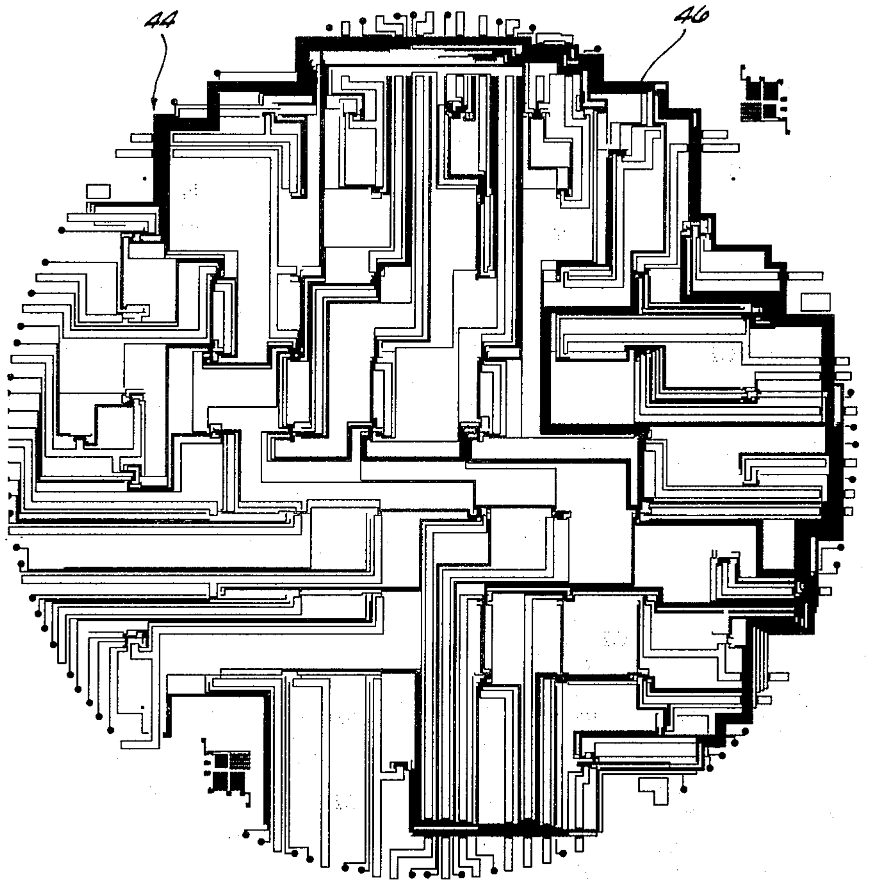
FIG. 5 is a top plan view of the third layer of the metalization illustrating the master pattern interconnect lines which are selectively connected to the exposed pads of usable cells and functionally interconnected cells at master pattern circuit locations.

Thereafter the top layer or third layer of metalization 44 such as, for example, aluminum, is formed on top of the second layer of dielectrical insulation 40 with the terminating ends or portions of the fixed or master pattern of interconnect lines 46 illustrated in FIG. 5 in registry with the vias 42 in the second layer of insulation 40. As a result, the signal connects at individual master pattern circuit locations are interconnected into a specified functional circuit which, when electrical signals are applied to the signal inputs thereof, will operate in a predetermined manner to produce output signals of predetermined characteristics at its output teminals. It should be understood that the standard pattern conductors or interconnect 46 in the top layer of metalization 44 are also formed with a relatively simple routing on a master pattern mask common to all wafers having usable cells at master pattern circuit locations and which are to be interconnected into a specific function part type circuit, by means of the photoresist technique in combination with etching techniques.

As previously mentioned, advantages of this device are that: there is a reduction in the number of point to point connections made in the third level standard signal routing; there is a decrease in the number of master pattern positions (circuits or cells) as a result of the interconnected functions in the second level of metalization; there is a decrease in the number of signal connect relocation lines in the second level metalization pattern due to the interconnection prior to relocation; and there is a significant reduction in the average logic signal line lengths due to the very efficient functional cell interconnections thereby reducing signal degradation caused by line resistance and capacitance.

While salient features have been illustrated and described with respect to a particular embodiment, it should be readily apparent that modifications can be made within the spirit and scope of the invention.

What is claimed is:

1. An integrated circuit interconnection method for interconnecting operable cells into an electrical function on an integrated circuit wafer having a plurality of operable and inoperable cells, the operable and inoperable cells having random positions in a non-uniform distribution and having primary signal-connect means associated therewith at a first level of wafer metallization, comprising the steps of:

preparing a master pattern both having predetermined circuit locations of operable cells including cells to be selected from any of the operable cells irrespective of their position and distribution and having partial interconnections among at least some of the operable cells or portions thereof, the predetermined circuit locations and the partial interconnections corresponding to a standardized configuration of integrated circuits for all wafers to be similarly processed into the electrical function;

testing the plurality of operable and inoperable cells at the primary signal-connect means to determine positions of operable and inoperable cells;

selecting operable cells from any of the tested operable cells irrespective of their position and distribution on the wafer, the number of the selected operable cells being at least equal to the number of predetermined circuit locations on the master pattern;

electrically coupling and routing the primary signal-connect means of each of the selected operable cells to the sites of secondary signal-connect means of each of the selected operable cells by insulation and metallizing formation and masking processes to form electrical conduction means and simultaneously configuring the electrical conduction means into the standardized configuration, thereby terminating each of the selected operable cells in the secondary signal-connect means and in the positions corresponding to the predetermined circuit locations of the master pattern; and further electrically coupling the wafer cells from the secondary signal-connect means into the electrical function by use of standard masking means identical to all of the wafers to be similarly processed into the electrical function.

2. The method of claim 1 wherein said coupling and routing step further comprises the steps of:

electrically isolating each of the inoperable cells, including each of the inoperable cells coinciding with any ones of the predetermined circuit locations, and electrically isolating each of the unselected operable cells by deposition of insulation material over the first level of metallization;

exposing the primary signal-connect means of the selected operable cells by masking and insulation material removal means; and routing the electrical conduction means into the configuration of the integrated circuit from the exposed primary signal-connect means to the sites of the secondary signal-connect means, whereby some of the secondary signal-connect means at the predetermined circuit locations are situated over a corresponding number of the inoperable cells in electrical isolation therefrom.

3. The method of claim 1 in which said coupling and routing step includes the step of routing the electrical conductors in multiply-connected line segments from the primary signal-connect means of the selected operable cells to the sites of the secondary signal-connect means.

4. The method of claim 1 in which said coupling and routing step includes the step of routing the electrical conductors in a plurality of interconnected line segments including curved line segments from the primary signal-connect means of the selected operable cells to the sites of the secondary signal-connect means and forming the line segments into the configuration of the integrated circuit.

5. The method of claim 1 for use with a plurality of the wafers, further including the steps of electrically coupling the primary signal-connect means of any ones of the selected operable cells of each of the wafers to the sites of the secondary signal-connect means and into the configuration of the integrated circuits and electrically coupling in an identical manner for each of the wafers the secondary signal-connect means thereof by use of the identical masking means into identical circuit configurations corresponding to the electrical function.

6. The method of claim 1 wherein said coupling and routing step comprises the steps of:

forming a first layer of photoresist material over the operable and inoperable cells and the wafer;

exposing portions of the first photoresist layer overlaying the primary signal-connect means of the selected operable cells through masking means to light to form exposed portions and unexposed portions of the first photoresist layer;

removing the unexposed portions of the first photoresist layer;

forming a layer of electrically insulating material over the cells and the exposed photoresist portions of the first layer;

heating the device to crack the insulating material over the first layer exposed photoresist portions;

removing the first layer exposed photoresist portions and the cracked insulating material to expose the primary signal-connect means of the selected cells;

forming a layer of electrically conductive material on the insulating material and the exposed primary signal-connect means;

forming a second layer of photoresist material on the layer of electrically conductive material;

exposing portions of the second photoresist layer in a pattern of interconnect lines both conforming to the configuration of the integrated circuits and extending from the exposed primary signal-connect means of the selected cells to the sites of the secondary signal-connect means to form exposed and unexposed portions of the second photoresist layer;

removing the second layer unexposed photoresist portions to expose portions of the conductive material;

removing the exposed portions of the conductive material; and removing the exposed photoresist portions, leaving the conductive material in the pattern of interconnect lines, extending from the primary signal-connect means of the selected operable cells to the sites of the secondary signal-connect means and conforming to the integrated circuit configuration.

7. An integrated circuit interconnection method for interconnecting operable cells into an electrical function on each of a plurality of integrated circuit wafers, each capable of performing the same electrical function, each of the wafers having a plurality of operable and inoperable cells in random positions of a non-uniform distribution, each of the operable and inoperable cells having primary signal-connect means associated therewith in a first level of metallization, comprising the steps of:

preparing a master pattern having predetermined circuit locations, for each and every one of the wafers, the master pattern defining identical positions of operable cells to be selected from any of the operable cells irrespective of the position and distribution thereof on individual ones of the wafers at a level subsequent to the first level of metallization;

testing the plurality of operative and inoperative cells of each of the wafers at the primary signal-connect means to determine locations of operable and inoperable cells;

for each of the wafers, selecting operable cells from any of the operable cells irrespective of the position and distribution thereof on individual ones of the wafers, the number of selected operable cells at least capable of performing the electrical function, and the number of the selected operable cells being at least equal to the number of predetermined circuit locations of the master pattern;

for each of the wafers, electrically insulating the operable and inoperable cells and the primary signal-connect means from one another to form a first insulation layer over the cells and over the primary signal-connect means, with feedthrough means in the first insulation layer opening to the primary signal-connect means of the selected operable cells;

for each of the wafers, electrically coupling and routing the primary signal-connect means of each of the selected operable cells through the feedthrough means and to sites of secondary signal-connect means of each of the selected operable cells and thereby terminating each of the selected operable cells in the identical positions corresponding to the predetermined circuit locations of the master pattern and simultaneously configuring conduction means among the secondary signal-connect means in the form of the integrated circuit; and further identical processing of each of the plurality of wafers from the secondary signal-connect means of each of the wafers by use of standard masking means identical to all of the wafers for interconnecting the selected operable cells thereof in such a manner as to enable each of the wafers to perform the electrical function.

8. A method as in claim 21 wherein said step of preparing the master pattern of the predetermined circuit locations and the integrated circuit configuration comprises the step of placing the locations in accordance with the expected density of the selected operable cells.

* * * * *